Feb. 24, 1970 F. E. McKEE 3,497,820
TWO-STAGE POWER AMPLIFIER CONNECTED TO AUTOTRANSFORMER
Filed Dec. 27, 1966
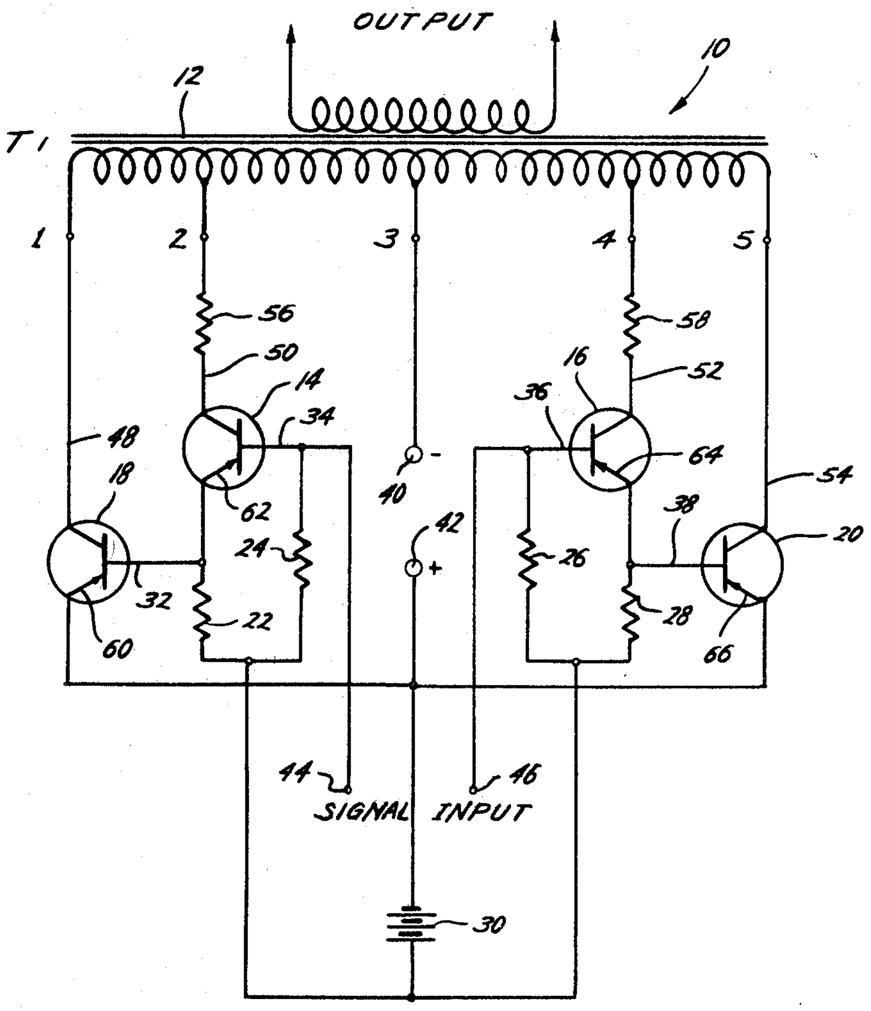
Fount E. McKee
INVENTOR.

United States Patent Office 3,497,820
Patented Feb. 24, 1970

3,497,820
TWO-STAGE POWER AMPLIFIER CONNECTED TO AUTOTRANSFORMER

Fount E. McKee, Houston, Tex., assignor to Tideland Signal Corporation, Houston, Tex., a corporation of Texas Filed Dec. 27, 1966, Ser. No. 605,012
Int. Cl. H03f *3/26*
U.S. Cl. 330—15 3 Claims

ABSTRACT OF THE DISCLOSURE

A power amplifier consisting of symmetrical halves each half consisting of a two-stage amplifier which is connected to half of the overall primary output windings. The present improvement in the power amplifier is provided by connecting the output of the first stage of each amplifier to a point on the transformer between the mid-point and one end through a resistor so that the transformer winding acts as an autotransformer to provide a voltage supply to the first stage amplifier but at a substantial reduction in the power requirements of the power amplifier.

Generally, it is old to provide a power amplifier having symmetrical halves both of which are connected to a transformer output and each of which consists of a two-stage amplifier. Generally, however, the first stage amplifiers have conventionally been connected to the negative side of the supply voltage or to a separate low voltage power source. The present invention is directed to connecting the first stage amplifiers to the primary of the output transformer to provide an autotransformer action to supply a voltage to the first stage amplifiers which consumes considerably less power than the conventional methods.

The present invention, therefore, has as a general object the provision of a power amplifier having symmetrical halves each of which include a two-stage amplifier in which the first stage of each amplifier is connected to the primary of the output transformer at a point between one end and the mid-point of the primary winding, and the parameters are chosen to provide a substantial power saving. The advantage of providing savings in power consumption is obvious, particularly if the power amplifier is used in remote unattended locations and actuated by battery power as the present improvement would result in providing a longer period of time between necessary service calls.

Other and further objects, features and advantages will be apparent from the following description of a presently preferred embodiment of the invention, given for the purpose of disclosure, and taken in conjunction with the accompanying drawing, where, The drawing is an electrical schematic of the power amplifier of the present invention.

Referring now to the drawing, reference numeral 10 generally indicates the power amplifier of the present invention which includes symmetrical halves, each half consisting of a two-stage amplifier the output of which is connected to half of the overall primary winding of an output transformer 12.

The first stages of the respective amplifiers are transistors 14 and 16 and the second stage of each of the transistor amplifiers are 18 and 20. Conventional biasing is provided by holding the base of each transistor positive relative to each respective emitter. Thus, biasing resistors 22, 24, 26 and 28 are all connected from a voltage source 30 to the bases 32, 34, 36 and 38 of transistor amplifiers 18, 14 16 and 20, respectively.

The power supply for the power amplifier 10 is supplied through terminals 40 and 42 and the signal input is applied to terminals 44 and 46. Thus, in the absence of an input signal at either of the terminals 44 and 46 no current will flow through the circuit or through the output transformer 12.

It is noted that the second stage amplifiers, 18 and 20, are connected by their collectors 48 and 54 to terminals 1 and 5, respectively of the output transformer 12. The above described power amplifier is generally conventional. However, in the conventional arrangement the collectors 50 and 52 of the amplifiers 14 and 16 respectively are conventionally connected to the terminal 3 and thus to the negative side of the voltage supply terminal 40 or to a separate low voltage power source (not shown).

The present invention is directed to providing an improvement in a conventional power amplifier which consumes considerably less power than the conventionally arranged amplifier. This is accomplished by connecting the collectors 50 and 52 of the amplifiers 14 and 16 through resistors 56 and 58 to the terminals 2 and 4, respectively, thereby providing the voltage source for the first stage amplifiers 14 and 16 by autotransformer action. That is, by autotransformer action terminal 2 will be more negative than terminal 1, and the portion of the primary winding of the transformer 12 between terminals 1 and 3 acts as an autotransformer with respect to the portion of the winding between terminals 1 and 2.

In operation, assuming that all of the transistor amplifiers 18, 14, 16 and 20 are off initially, when a signal pulse is applied to the terminal 44 it is also supplied to the base 34 of the amplifier 14 whereby amplifier 14 is turned on and current flows into its emitter 62 coming from the base 32 of transistor amplifier 18 which is also turned on. Current now flows from the collector 48 of transistor 18 into terminal 1 of the autotransformer primary winding between terminals 1 and 2. Since the input signal to terminal 44 is of a sufficient magnitude to cause the transistor 18 to go into saturation, all of the supply voltage at terminals 40 and 42 is present across the transformer windings between terminals 1 and 3 less the saturation voltage of transistor 18. Terminal 2 will be more negative than terminal 1 and therefore the collector 50 of transistor 14 will be at a more negative potential than the collector 48 of transistor 18. Since the portion of the transformer 12 connected between terminals 1 and 3, act as an autotransformer with respect to terminals 1 and 2, the voltage at the collector 50 of transistor 14 depends upon the turns ratio of winding $N_1$ (number of turns between terminals 1 and 2) and the winding $N_2$ (number of turns between terminals 1 and 3). This ratio can be chosen so that the transistor 14 is in the active region or in saturation. However, in the interest of providing as small a power dissipation as possible, the voltage drop from the emitter 62 to the collector 50 of transistor 14 is selected as a minimum in either event. Of course, since the current of the emitter 62 of transistor 14 must be of a sufficient magnitude to drive the base 32 of transistor 18, the lower limit of the current of emitter 62 will be fixed by a particular application. Therefore, the power that is dissipated in transistor 14 will be essentially determined by the voltage across the collector 50 and its emitter 62. By connecting the collector 50 through the resistor 56 to the terminal 2 instead of to terminal 3 or a separate voltage source, the present structure provides a small minimum drop while maintaining the necessary current level to actuate transistor 18 in order to insure a minimum power dissipation in transistor 14.

Analyzing the power dissipation in the structure shown in the drawing for the application of an input pulse at terminal 44, the power dissipated in transistor 14 plus the power dissipated in the resistor 56 is as follows:

$$P = I_c(N_1/N_2)V_B - V_{BE}I_c + I_c^2R \quad (1)$$

where:

$I_c$=Collector current of transistor 14,
$N_1$=Number of turns between terminals 1 and 2,
$N_2$=Number of turns between terminals 1 and 42,
$V_B$=Voltage supply between terminals 3 and 6,
R=Value of resistor 56,
$V_{BE}$=Base-emitter voltage of transistor 18

In contrast in the conventional arrangement mentioned above with the collector 50 connected through a resistor to terminal 3, the power dissipated is given by the following formula:

$$P = V_BI_c - V_{BE}I_c \quad (2)$$

where the terms have the same values as previously given.

Thus comparing the two power equations, it is seen that the condition for less power to be dissipated in the circuit shown in the drawing and in the conventional arrangement is the following condition:

$$I_c(N_1/N_2)V_B + I_c^2R < V_BI_c$$

Since $N_1$ is chosen small compared to $N_2$, the first term on the left side of the inequality, is small compared to the right side of the inequality. Since R has a lower limit of 0 ohms, it can be chosen small such that the term $I_c^2R$ is much smaller than $V_BI_c$. Therefore, for the proper choice of the term $(N_1/N_2)$ and R, the inequality is satisfied and the present circuit will provide a considerable power saving as compared to the conventional circuit.

The operation of the second half of the power amplifier 10 which includes the two stage amplifiers 16 and 20 is similar to that as described as to operation of the first half. That is, when the negative input pulse is applied to the terminal 46 the input to the second symmetrical half of the power amplifier 10, the operation is identical. That is, an input signal to the base 36 of transistor 16 turns on transistor 16 and also transistor 20 and current flows into emiter 64 of transistor 16 from the base 38 of transistor 20. Current now flows from the collector 54 into terminal 5 of the autotransformer primary winding between terminals 4 and 5 and the supply voltage between terminals 40— and 42 is present across the terminals 5 and 3, less the saturation voltage of transistor 20. Again since the collector 52 of the first stage amplifier, here transistor 16, is connected to terminal 4 through limiting resistor 58, the voltage at the collector 52 of transistor 16 will depend upon the ratio of the transformer windings between terminals 5 and 3 and 5 and 4.

Thus, the power amplifier 10 provides the necessary current, at a considerable power savings, to operate the final amplifiers 18 and 20 by utilizing a minimum power dissipation in connecting the first stage of the transistor amplifiers 14 and 16 to the output transformer 12 at locations between its mid-point and one end to provide a voltage supply to the first stage amplifiers through auto transformer action.

The present invention, therefore, is well adapted to carry out the objects and attain the ends and advantages mentioned as well as others inherent therein. While a presently preferred embodiment of the invention is given for the purpose of disclosure, numerous changes in the details of construction and arrangement of parts may be made which will readily suggest themselves to those skilled in the art and which are encompassed within the spirit of the invention and the scope of the appended claims.

What is claimed is:

1. In a power amplifier connected to the primary of an output transformer and having a power supply connected to the mid-point of the primary and the power amplifier including two symmetrical halves, each half including a first amplifier having a base, an emitter and a collector, the emitter being connected to the power supply and the collector being connected to one end of the primary of said transformer, and a second amplifier for receiving the signal input and having a base, an emitter and collector, the emitter of the second amplifier being connected to the base of the first amplifier, the improvement comprising, the collector of the second amplifier being connected to the primary of the transformer at a point between the said one end and said mid-point thereby providing an autotransformer action to supply a voltage to the second amplifier and reducing the power requirements of said power amplifier 2. In a power amplifier connected to the primary of an output transformer and having a power supply connected to the mid-point of the primary and the amplifier including two symmetrical halves, each half including a first transistor having a base, emitter and collector and whose emitter is connected to the supply voltage and the collector of said first transistors is connected to opposite ends of the primary coil, and a second transistor having a base, emitter and collector and whose base is connected to the signal input of the amplifier, the emitter of the second transistor being connected to the base of the first amplifier, the improvement comprising, the collector of the second transistor connected through a resistance to the primary of the output transformer at a point between said end and said mid-point thereby providing an autotransformer action to supply a voltage to the second amplifier and reducing the power requirements of said power amplifier.

3. In a power amplifier connected to the primary of an output transformer and having a battery power supply, the negative contact of which is connected to the midpoint of the primary and the amplifier including two symmetrical halves, each half including a first transistor whose collector-emitter circuit is connected between the positive side of the battery and one end of the primary of the transformer, and a second transistor whose base is connected to the signal input of the amplifier, the improvement comprising, the collector emitter circuit of the second transistor connected between the base of the first transistor and through a resistance R to the primary of the output transformer at a point between said one end and said mid-point and in which the parameters are chosen so that $$I_c(N_1/N_2)V_B + I_c^2R < V_BI_c$$

wherein, $I_c$ is the collector current of the second transistor,
$N_1$ is the number of primary turns between said end point and the point of connection of the second transistor,
$N_2$ is the number of primary turns between said end point and the mid-point of said primary,
$V_B$ is the battery voltage.

References Cited

UNITED STATES PATENTS 3,416,091 12/1968 Overtveld .......... 330—15

FOREIGN PATENTS 810,417 3/1959 Great Britain.

ROY LAKE, Primary Examiner
LAWRENCE J. DAHL, Assistant Examiner

U.S. Cl. X.R.

330—30